US012777898B2

(12) United States Patent
Wu et al.

(10) Patent No.: US 12,777,898 B2
(45) Date of Patent: Oct. 27, 2026

(54) SEMICONDUCTOR DEVICE HAVING TESTING MODULE DISPOSED WITHIN SCRIBE LINE AND METHOD FOR MANUFACTURING THE SAME

(71) Applicant: NANYA TECHNOLOGY CORPORATION, New Taipei City (TW)

(72) Inventors: Jian-Ping Wu, New Taipei City (TW); Jui-Hsiu Jao, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 328 days.

(21) Appl. No.: 18/665,866

(22) Filed: May 16, 2024

(65) Prior Publication Data

US 2025/0336733 A1 Oct. 30, 2025

Related U.S. Application Data

(62) Division of application No. 18/650,416, filed on Apr. 30, 2024.

(51) Int. Cl.

*H10P 74/00* (2026.01)
*H10P 54/00* (2026.01)
*H10W 46/00* (2026.01)

(52) U.S. Cl.

CPC ............ *H10P 74/277* (2026.01); *H10P 54/00* (2026.01); *H10W 46/00* (2026.01); *H10W 46/503* (2026.01)

(58) Field of Classification Search

CPC ....... H10P 74/277; H10P 54/00; H10W 46/00
See application file for complete search history.

(56) References Cited

U.S. PATENT DOCUMENTS

| | | | | |
|---|---|---|---|---|
| 9,130,056 | B1 | 9/2015 | Holden et al. | |
| 2014/0319522 | A1* | 10/2014 | Daubenspeck | H10W 42/00 257/737 |

FOREIGN PATENT DOCUMENTS

| | | | |
|---|---|---|---|
| CN | 101150094 | B | 2/2011 |
| CN | 110246813 | A | 9/2019 |
| CN | 113921500 | A | 1/2022 |
| TW | 463320 | B | 11/2001 |
| TW | 200709374 | A | 3/2007 |
| TW | 200719431 | A | 5/2007 |

(Continued)

OTHER PUBLICATIONS

Office Action and and the search report mailed on Jul. 24, 2025 related to Taiwanese Application No. 114109665.

(Continued)

*Primary Examiner* — Michael Jung
(74) *Attorney, Agent, or Firm* — Xuan Zhang

(57) ABSTRACT

A semiconductor device and method for manufacturing the same are provided. The semiconductor device includes a first active region, a second active region, a first testing module, and a second testing module. The second active region is separated by the first active region by a scribe line. The scribe line extends along a first direction. The first testing module abuts the first active region and is disposed within the scribe line. The second testing module abuts the second active region and is disposed within the scribe line. The first testing module and the second testing module are arranged along a second direction substantially orthogonal to the first direction.

9 Claims, 10 Drawing Sheets

(56) References Cited

FOREIGN PATENT DOCUMENTS

| | | |
|---|---|---|
| TW | 201432873 A | 8/2014 |
| TW | 202238832 A | 10/2022 |

OTHER PUBLICATIONS

Summary translation of Office Action and and the search report mailed on Jul. 24, 2025 related to Taiwanese Application No. 114109665.
Office Action and and the search report mailed on Apr. 25, 2025 related to Taiwanese Application No. 113126384.
Summary translation of Office Action and and the search report mailed on Apr. 25, 2025 related to Taiwanese Application No. 113126384.

* cited by examiner

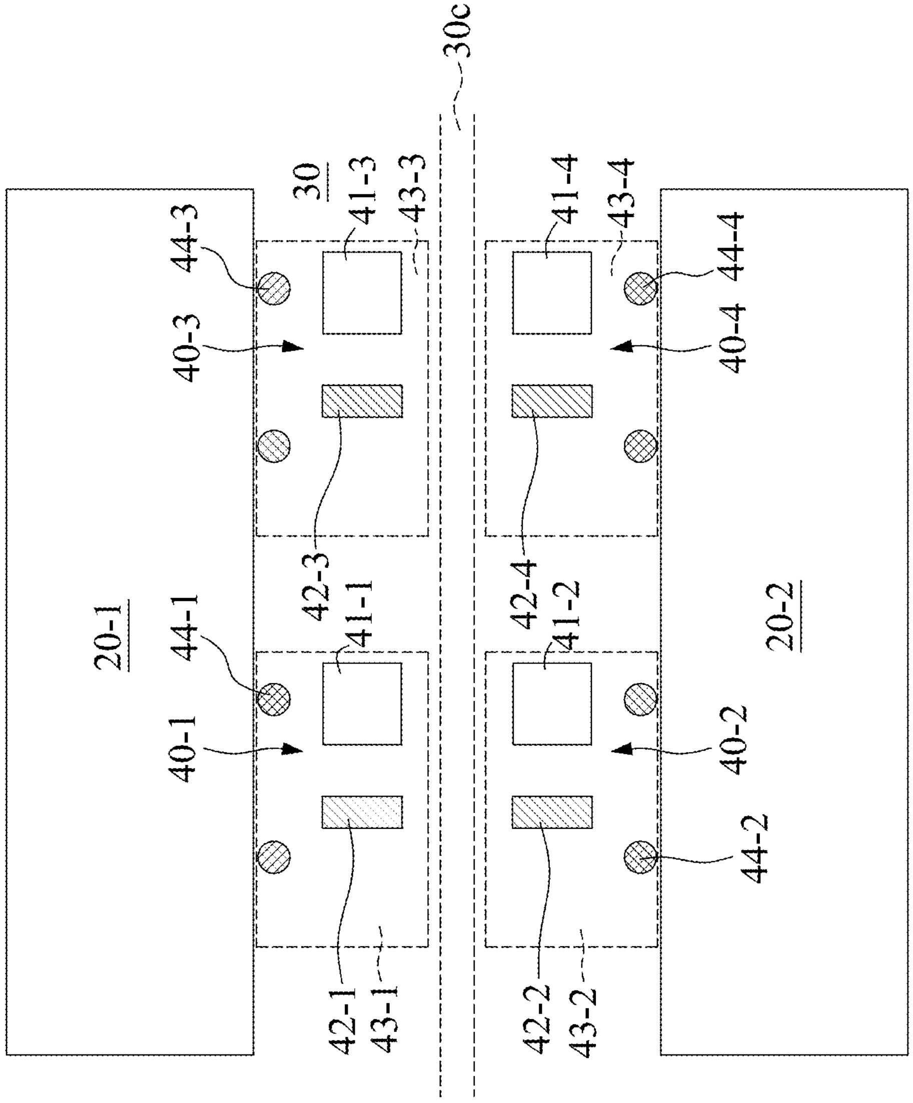
FIG. 8
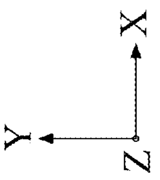

SEMICONDUCTOR DEVICE HAVING TESTING MODULE DISPOSED WITHIN SCRIBE LINE AND METHOD FOR MANUFACTURING THE SAME

CROSS-REFERENCE TO RELATED APPLICATION

This application is a divisional application of U.S. Non-Provisional application Ser. No. 18/650,416 filed Apr. 30, 2024, which is incorporated herein by reference in its entirety.

TECHNICAL FIELD

The present disclosure relates to a semiconductor device, and more particularly, to a semiconductor device including a testing module.

DISCUSSION OF THE BACKGROUND

When performing a singulation technique, the cutting of metallic material within a scribe line may generate smithereens, potentially causing damage to the equipment chamber. This is especially true when cutting conductive vias with relatively great height, as it produces a significant amount of smithereens. To address these issues, a new semiconductor device and manufacturing method are needed.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a first active region, a second active region, a first testing module, and a second testing module. The second active region is separated by the first active region by a scribe line. The scribe line extends along a first direction. The first testing module abuts the first active region and is disposed within the scribe line. The second testing module abuts the second active region and is disposed within the scribe line. The first testing module and the second testing module are arranged along a second direction substantially orthogonal to the first direction.

Another aspect of the present disclosure provides a semiconductor device. The semiconductor device includes a first active region, a second active region, and a first testing module. The second active region is separated by the first active region by a scribe line. The scribe line extends along a first direction. The first testing module abuts the first active region and is disposed within the scribe line. The first testing module includes a testing pad, a testing circuit, and a via structure. The via structure connects the testing pad and the testing circuit. The via structure is closer to the first active region than the testing circuit is.

Another aspect of the present disclosure provides a method for manufacturing a semiconductor device. The method includes: forming a plurality of active regions comprising a first active region and a second active region separated from the first active region by a scribe line which extends along a first direction; forming a first testing module and a second testing module within the scribe line, wherein the first testing module and the second testing module are arranged along a second direction substantially orthogonal to the first direction.

The embodiments of the present disclosure provide a semiconductor device including testing modules within a scribe line which extends along a first direction. A first testing modules and a second testing module are arranged along a second direction substantially perpendicular to the first direction. A cutting region is located between the first testing module and the second testing module. With this arrangement, the conductive elements (such as traces and/or vias) of the first testing module and second testing module can avoid being cut, thereby preventing damage to the equipment chamber from smithereens of metallic material.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers referring to similar elements throughout the Figures, and:

FIG. 8 illustrates one or more stages of an example of a method for manufacturing a semiconductor device according to some embodiments of the present disclosure.

DETAILED DESCRIPTION

Figure 1:
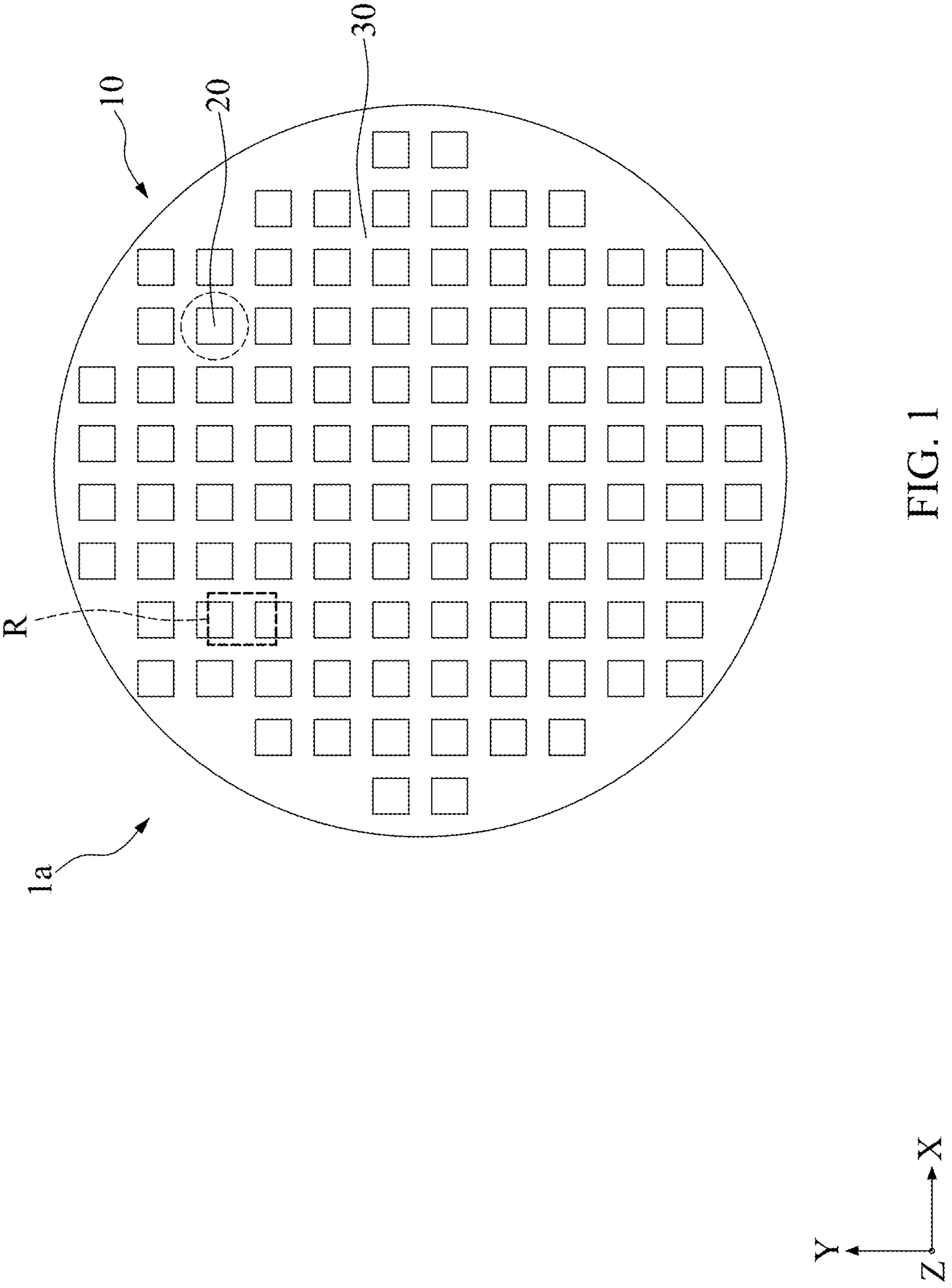
FIG. 1 is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Referring to FIG. 1, FIG. 1 is a top view of a semiconductor device 1*a* according to some embodiments of the present disclosure. The semiconductor device 1*a* may include a wafer 10 and a plurality of active regions 20 on the wafer 10. Each of the active regions 20 may be separated by a scribe line 30.

The active region 20 (or a die region) may include an integrated circuit(s). The active region 20 may include active component, such as a memory circuit (e.g., dynamic random access memory (DRAM) circuit, a static random access memory (SRAM) circuit, etc.), a power management circuit (e.g., power management integrated circuit (PMIC) circuit), a logic circuit (e.g., central processing unit (CPU), graphics processing unit (GPU), application processor (AP), microcontroller, etc.), a radio frequency (RF) circuit, a sensor circuit, a micro-electro-mechanical-system (MEMS) circuit, a signal processing circuit (e.g., digital signal processing (DSP) circuit), a front-end circuit (e.g., analog front-end (AFE) circuit) or other active components. The active region 20 may include a passive component(s), such as a resistor, an inductor, or other passive components.

The scribe line 30 may extend along the X direction and the Y direction. In some embodiments, the scribe line 30 may be configured to separate the active regions 20. In some embodiments, the scribe line 30 may be a region in which a testing module(s) for testing the performance of the active region 20 is formed. In some embodiments, the scribe line 30 is a region that may be cut or sawed by a singulation technique.

Although not shown in FIG. 1, it should be noted that the semiconductor device 1*a* may include other regions based on requirements. For example, a sealing region, which includes multiple pads and vias within a substrate, may be located between the active region 20 and the scribe line 30 for preventing cracks when a singulation technique is performed.

Figure 2:
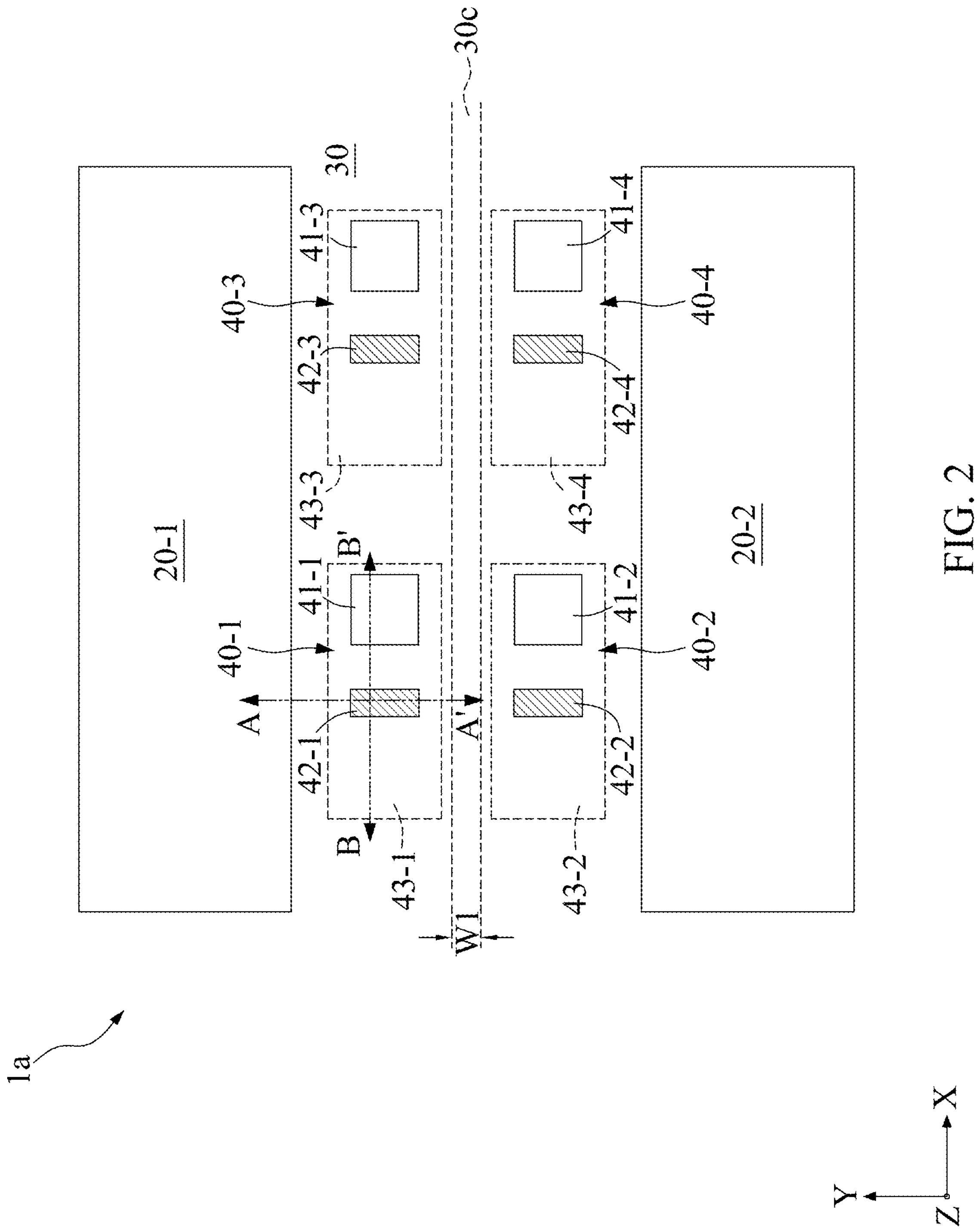
FIG. 2 is an enlargement view of a dotted region as shown in FIG. 1, in accordance with some embodiments of the present disclosure.

FIG. 2 is an enlargement view of a dotted region R as shown in FIG. 1, in accordance with some embodiments of the present disclosure.

The semiconductor device 1*a* may include an active region 20-1 and an active region 20-2 which abuts the active region 20-1. The active region 20-1 and active region 20-2 may be arranged along the Y direction. The active region 20-1 and the active region 20-2 may be separated by the scribe line 30.

The scribe line 30 may extend along the X direction. The scribe line 30 may be disposed between the active region 20-1 and active region 20-2. In some embodiments, the scribe line 30 may define a cutting region 30*c*. In some embodiments, the cutting region 30*c* may be a region on which a singulation technique is performed. In some embodiments, the cutting region 30*c* may be removed or cut by a laser grooving technique, a laser drilling technique, or other suitable techniques. In some embodiments, the width W1 of the cutting region 30*c* along the Y direction may range between 1 um and 30 um. The cutting region 30*c* may extend along the first direction. In some embodiments, the remaining region of the scribe line, other than the cutting region 30*c*, may remain connected to the active region 20-1 or active region 20-2 after the singulation technique is performed.

In some embodiments, the semiconductor device 1*a* may include testing modules 40-1, 40-2, 40-3, and 40-4. The testing modules 40-1, 40-2, 40-3, and 40-4 may be located within the scribe line 30. In some embodiments, the testing module 40-1 and the testing module 40-2 may be arranged along the Y direction. In some embodiments, the testing module 40-1 and the testing module 40-3 may be arranged along the X direction. In some embodiments, the testing module 40-2 and the testing module 40-4 may be arranged along the X direction.

In some embodiments, the testing module 40-1 may include a testing circuit 41-1, a testing pad 42-1, and an interconnection structure 43-1. The testing module 40-2 may include a testing circuit 41-2, a testing pad 42-2, and an interconnection structure 43-2. The testing module 40-3 may include a testing circuit 41-3, a testing pad 42-3, and an interconnection structure 43-3. The testing module 40-4 may include a testing circuit 41-4, a testing pad 42-4, and an interconnection structure 43-4. In some embodiments, the cutting region 30*c* may be disposed between the testing module 40-1 and testing module 40-2. In some embodiments, the cutting region 30*c* may be disposed between the testing module 40-3 and testing module 40-4.

Each of the testing circuits 41-1 to 41-4 may be configured to be tested to obtain the electrical properties of the active region 20-1 or 20-2. In some embodiments, each of the testing circuits 41-1 to 41-4 may include an active component(s), such as a memory circuit (e.g., DRAM circuit and SRAM circuit), a power management circuit (e.g., PMIC circuit), a logic circuit (e.g., CPU, GPU, AP, microcontroller, etc.), an RF circuit, a sensor circuit, a MEMS circuit, a signal processing circuit (e.g., DSP circuit), a front-end circuit (e.g., AFE circuit) or other active components. Each of the testing circuits 41-1 to 41-4 may include a passive component(s), such as a resistor, an inductor, or other passive components.

In some embodiments, the testing circuit 41-1 and the testing circuit 41-3 may be arranged or aligned along the X direction. In some embodiments, the testing circuit 41-1 and the testing circuit 41-2 may be arranged or aligned along the Y direction. In some embodiments, each of the testing circuits 41-1 to 41-4 may be free from overlapping the cutting region 30*c* along the Z direction. In some embodiments, the cutting region 30*c* may be disposed between the testing circuit 41-1 and the testing circuit 41-2. In some embodiments, the cutting region 30*c* may be disposed between the testing circuit 41-3 and testing circuit 41-4. Each of the testing circuits 41-1 to 41-4 may be disposed outside the cutting region 30*c*.

Each of the testing pads 42-1 to 42-4 may be exposed by the surface of the wafer 10. Each of the testing pads 42-1 to 42-4 may be electrically connected to the testing circuits 41-1 to 41-4, respectively. Each of the testing pads 42-1 to 42-4 may be configured to be connected to an external device (not shown) so that the electrical properties of the testing circuits 41-1 to 41-4 may be measured. In some embodiments, the testing circuit 41-1 and the testing pad 42-1 may be arranged along the X direction from a top view. In some embodiments, the testing pad 42-1 and testing pad 42-2 may be arranged or aligned along the Y direction. In some embodiments, the testing pad 42-1 and testing pad 42-3 may be arranged or aligned along the X direction. In some embodiments, each of the testing pads 42-1 to 42-4 may be free from overlapping the cutting region 30*c* along the Z direction. In some embodiments, the cutting region 30*c* may be disposed between the testing pad 42-1 and testing pad 42-2. In some embodiments, the cutting region 30*c* may be disposed between the testing pad 42-3 and testing pad 42-4.

Each of the interconnection structures 43-1 to 43-4 may be disposed within a substrate (not annotated in FIG. 2). The interconnection structure 43-1 may electrically connect the testing circuit 41-1 and the testing pad 42-1. The interconnection structure 43-2 may electrically connect the testing circuit 41-2 and the testing pad 42-2. The interconnection structure 43-3 may electrically connect the testing circuit 41-3 and the testing pad 42-3. The interconnection structure 43-4 may electrically connect the testing circuit 41-4 and the testing pad 42-4. Each of the interconnection structures 43-1 to 43-4 may include a redistribution structure. The redistribution structure may include conductive traces and vias embedded within a dielectric structure. In some embodiments, each of the interconnection structures 43-1 to 43-4 may be free from overlapping the cutting region 30*c* along the Z direction. In some embodiments, the cutting region 30*c* may be disposed between the interconnection structure 43-1 and interconnection structure 43-2. In some embodiments, the cutting region 30*c* may be disposed between the interconnection structure 43-3 and interconnection structure 43-4.

Figure 3:
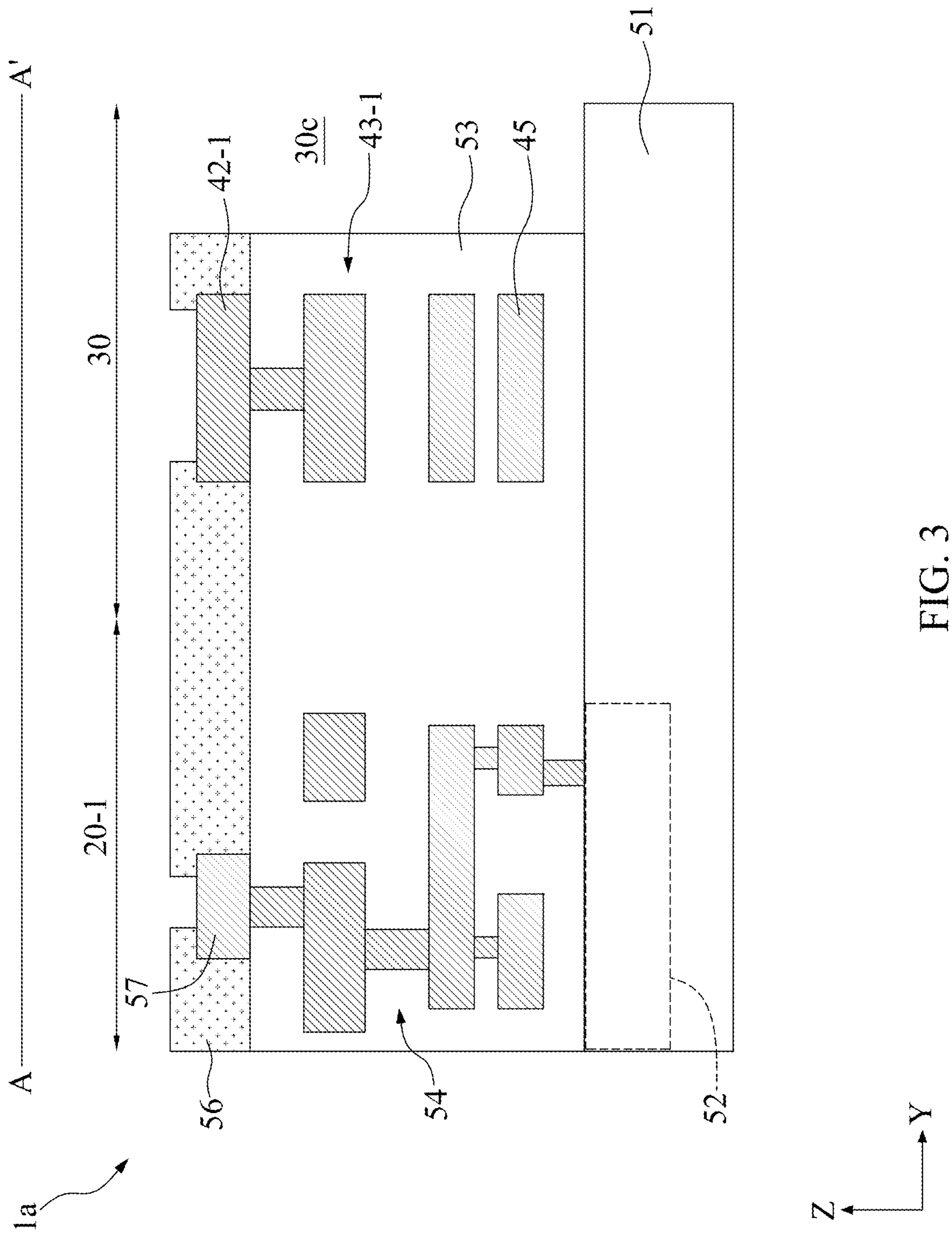
FIG. 3 is a cross-sectional view along line A-A' of FIG. 2, in accordance with some embodiments of the present disclosure.
Figure 4:
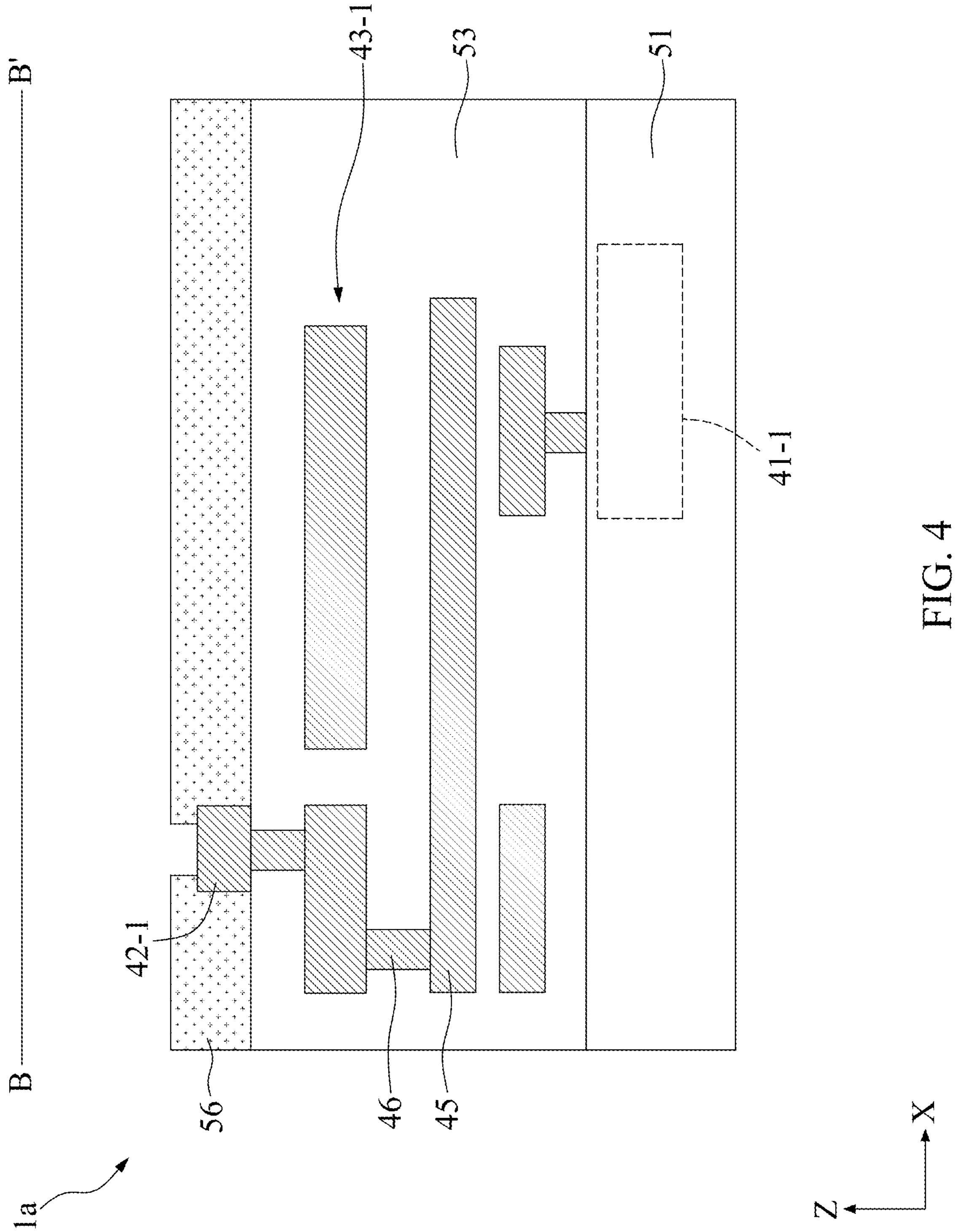
FIG. 4 is a cross-sectional view along line B-B' of FIG. 2, in accordance with some embodiments of the present disclosure.

Referring to FIG. 3 and FIG. 4, FIG. 3 is a cross-sectional view along line A-A' of FIG. 2, and FIG. 4 is a cross-sectional view along line B-B' of FIG. 2, in accordance with some embodiments of the present disclosure.

The semiconductor device 1*a* may include a substrate 51. The substrate 51 can be a semiconductor substrate, such as a bulk semiconductor, a semiconductor-on-insulator (SOI) substrate, or the like. The substrate 51 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 51 can have a multilayer structure, or the substrate 51 can include a multilayer compound semiconductor structure.

As shown in FIG. 3 and FIG. 4, the testing circuit 41-1 may be at least partially formed within or over the substrate 51.

The semiconductor device 1*a* may include an integrated circuit (IC) region 52. The IC region 52 may be at least partially formed within or over the substrate 51. The IC region 52 may include ICs, which may include transistors and/or other suitable components.

The semiconductor device 1*a* may include a dielectric structure 53. The dielectric structure 53 may be disposed on or over the substrate 51. The interconnection structure 43-1, including traces 45 and vias 46, may be disposed within the dielectric structure 53. In some embodiments, the dielectric structure 53 may be disposed in the active region 20-1. In some embodiments, a portion of the dielectric structure 53 may be disposed in the scribe line 30. In some embodiments, the dielectric structure 53 may be disposed outside the cutting region 30*c*. In some embodiments, the cutting region 30*c* may be defined by the sidewall of the dielectric structure 53. The dielectric structure 53 may include an oxygen-containing dielectric material, which may include silicon-oxide based materials such as tetra ethyl ortho silicate (TEOS), phospho-silicate glass (PSG), boron-silicate glass (BSG), boron-doped phospho-silicate glass (BPSG), or other suitable materials.

The semiconductor device 1*a* may include a redistribution structure 54. The redistribution structure 54 may be located within the active region 20-1. The redistribution structure 54 may be disposed within the dielectric structure 53. The redistribution structure 54 may include a plurality of conductive traces and vias. The redistribution structure 54 may be electrically connected to the IC region 52.

The semiconductor device 1*a* may include a passivation layer 56. The passivation layer 56 may be disposed on or over the redistribution structure 54. The testing pad 42-1 may be exposed by the passivation layer 56. The passivation layer 56 may include a single-layer structure or a stacked structure including multiple material layers. The passivation layer 56 may include a silicon oxide layer, a silicon nitride layer, a silicon oxynitride layer, or other suitable materials.

The semiconductor device 1*a* may include a terminal 57. The terminal 57 may be disposed on or over the redistribution structure 54. The terminal 57 may be electrically connected to the IC region 52. The terminal 57 may be exposed by the passivation layer 56. The terminal 57 may be configured to be connected to an external device (not shown). The terminal 57 may include one or more layers, such as a metallic pad, a under bump metallization (UBM), and other suitable layers. The metallic pad may include copper, tungsten, ruthenium, iridium, nickel, osmium, rhodium, aluminum, molybdenum, cobalt, tantalum, alloys thereof, and a combination thereof. The UBM may include tin, silver, nickel, alloys thereof, and a combination thereof.

As shown in FIG. 4, the testing circuit 41-1 may be at least partially formed within or over the substrate 51. The interconnection structure 43-1 may include trace 45 and via 46. The via 46 may have a thickness (or an aspect ratio) greater than that of the trace 45 along the Y direction. The via 46 may connect traces 45 located at different levels.

In this embodiment, at least two testing modules (e.g., the testing module 40-1 and testing module 40-2) are disposed within the active region 20-1 and active region 20-2. For example, the active region 20-1, active region 20-2, testing module 40-1, and testing module 40-2 may be at least partially aligned along the Y direction. The density of the testing modules is greater than that of a comparative semiconductor device at least along the Y direction. In this embodiment, the testing modules (e.g., the testing modules 40-1 to 40-4) are disposed beyond the cutting region 30*c*. As a result, the damage caused by smithereens of metallic material generated by a singulation technique to the equipment chamber may be prevented.

Figure 5:
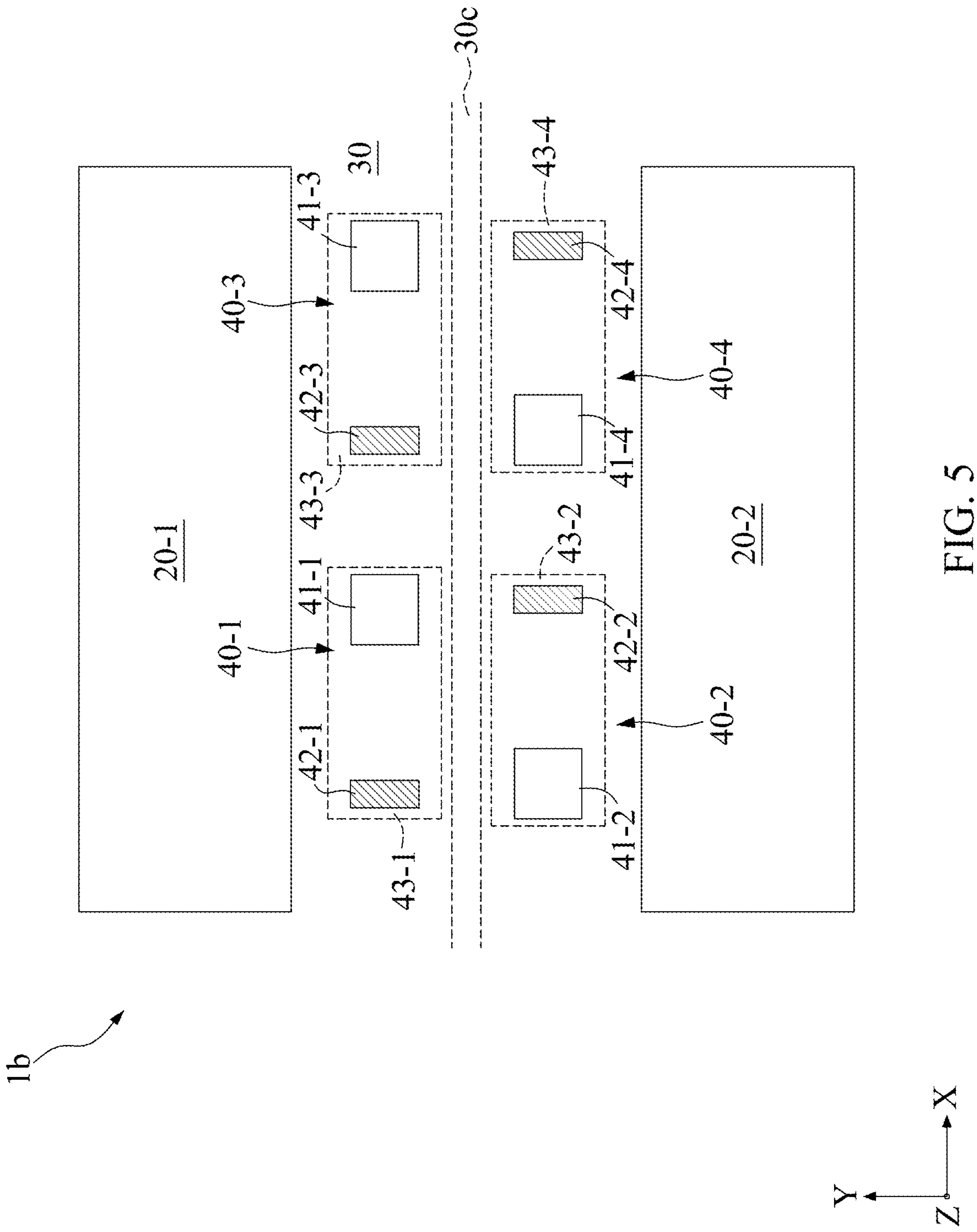
FIG. 5 is a top view of a semiconductor device, in accordance with some embodiments of the present disclosure.

FIG. 5 is a top view of a semiconductor device 1*b*, in accordance with some embodiments of the present disclosure. The semiconductor device 1*b* has a structure similar to that of the semiconductor device 1*a*, with differences below.

In some embodiments, the testing pad 42-1 may be misaligned with the testing pad 42-2 along the Y direction. In some embodiments, the testing pad 42-3 may be misaligned with the testing pad 42-4 along the Y direction. In some embodiments, the testing pad 42-1 may be at least partially aligned with the testing circuit 41-2 along the Y direction from a top view. In some embodiments, the testing circuit 41-1 may be at least partially aligned with the testing pad 42-2 along the Y direction from a top view. In some embodiments, the testing pad 42-3 may be at least partially aligned with the testing circuit 41-4 along the Y direction from a top view. In some embodiments, the testing circuit 41-3 may be at least partially aligned with the testing pad 42-4 along the Y direction from a top view.

Figure 6:
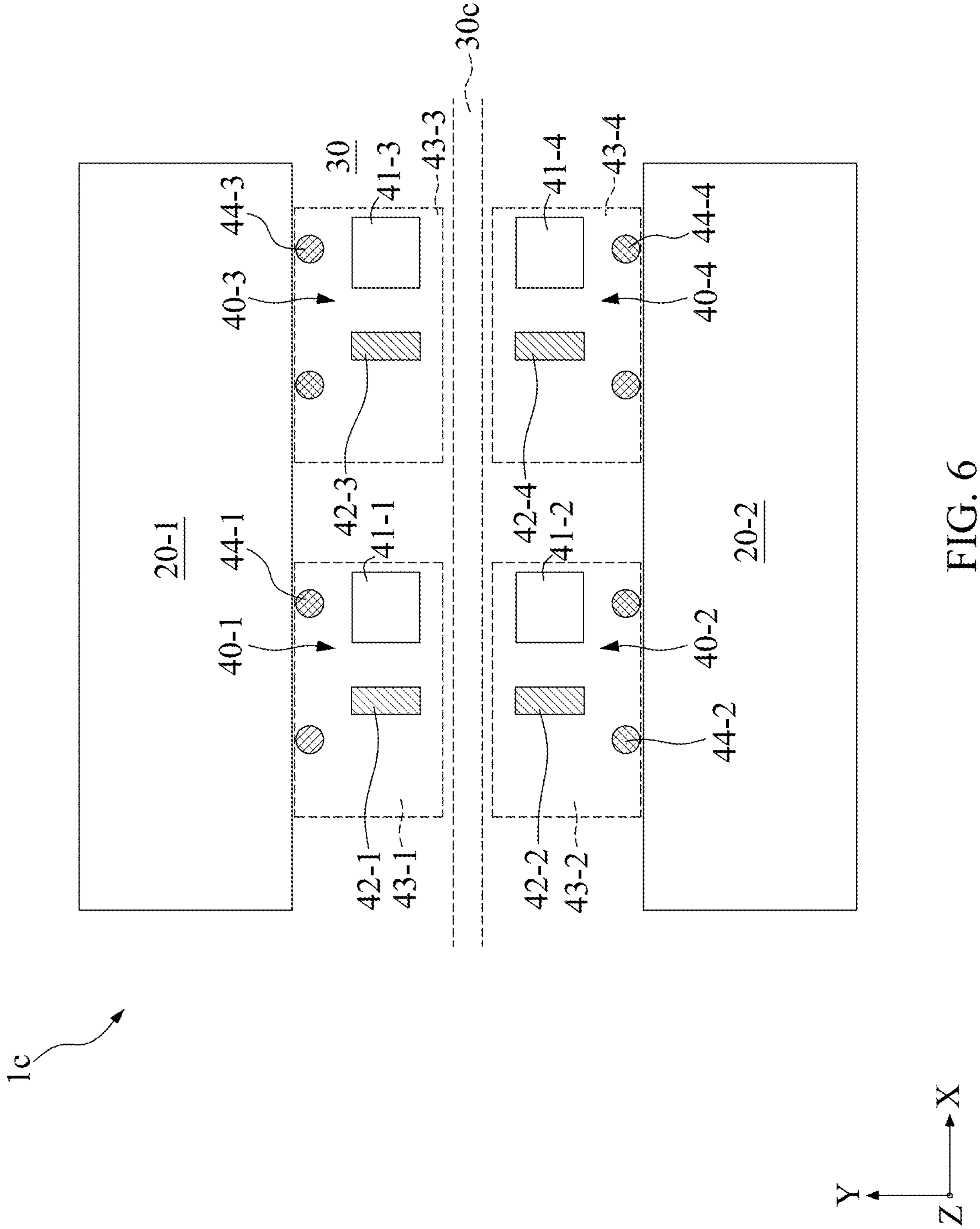
FIG. 6 is a top view of a semiconductor device, in accordance with some embodiments of the present disclosure.

FIG. 6 is a top view of a semiconductor device 1*c*, in accordance with some embodiments of the present disclosure. The semiconductor device 1*c* has a structure similar to that of the semiconductor device 1*a*, with differences below.

The interconnection structure 43-1 may include a via structure 44-1. The interconnection structure 43-2 may include a via structure 44-2. The interconnection structure 43-3 may include a via structure 44-3. The interconnection structure 43-4 may include a via structure 44-4. Each of the via structures 44-1 to 44-4 may include conductive vias within each of the dielectric layers of the dielectric structure 53.

In some embodiments, the via structure 44-1 may be disposed at the edge of the interconnection structure 43-1. In some embodiments, the via structure 44-1 may be closer to the active region 20-1 than the testing circuit 41-1 is. In some embodiments, the via structure 44-1 may be closer to the active region 20-1 than the testing pad 42-1 is. For example, the via structure 44-1 may include at least one conductive via which is closer to the active region 20-1 than the testing circuit 41-1 (or testing pad 42-1) is. The average distance between the conductive vias of the via structure 44-1 and the active region 20-1 is less than that of the active region 20-1 than the testing circuit 41-1 (or testing pad 42-1) is.

In some embodiments, the via structure 44-2 may be closer to the active region 20-2 than the testing circuit 41-2 is. In some embodiments, the via structure 44-2 may be closer to the active region 20-2 than the testing pad 42-2 is.

In some embodiments, the via structure 44-3 may be closer to the active region 20-1 than the testing circuit 41-3 is. In some embodiments, the via structure 44-3 may be closer to the active region 20-1 than the testing pad 42-3 is.

In some embodiments, the via structure 44-4 may be closer to the active region 20-2 than the testing circuit 41-4 is. In some embodiments, the via structure 44-4 may be closer to the active region 20-4 than the testing pad 42-4 is.

The testing circuit 41-1 may be disposed between the via structure 44-1 and the cutting region 30*c*. The testing pad 42-1 may be disposed between the via structure 44-1 and the cutting region 30*c*. The testing circuit 41-2 may be disposed between the via structure 44-2 and the cutting region 30*c*. The testing pad 42-2 may be disposed between the via structure 44-2 and the cutting region 30*c*. The testing circuit 41-3 may be disposed between the via structure 44-3 and the cutting region 30*c*. The testing pad 42-3 may be disposed between the via structure 44-3 and the cutting region 30*c*. The testing circuit 41-4 may be disposed between the via structure 44-4 and the cutting region 30*c*. The testing pad 42-4 may be disposed between the via structure 44-4 and the cutting region 30*c*.

Since the conductive via of the via structures 44-1 to 44-4 has a relatively large thickness, a significant amount of smithereens may be generated when the via structures 44-1 to 44-4 are cut when performing a singulation technique. In this embodiment, the distance between the conductive vias (e.g., the via structures 44-1 to 44-4) and the cutting region 30*c* is relatively large, thereby reducing the generation of smithereens of metallic material during a singulation technique.

Figure 7:
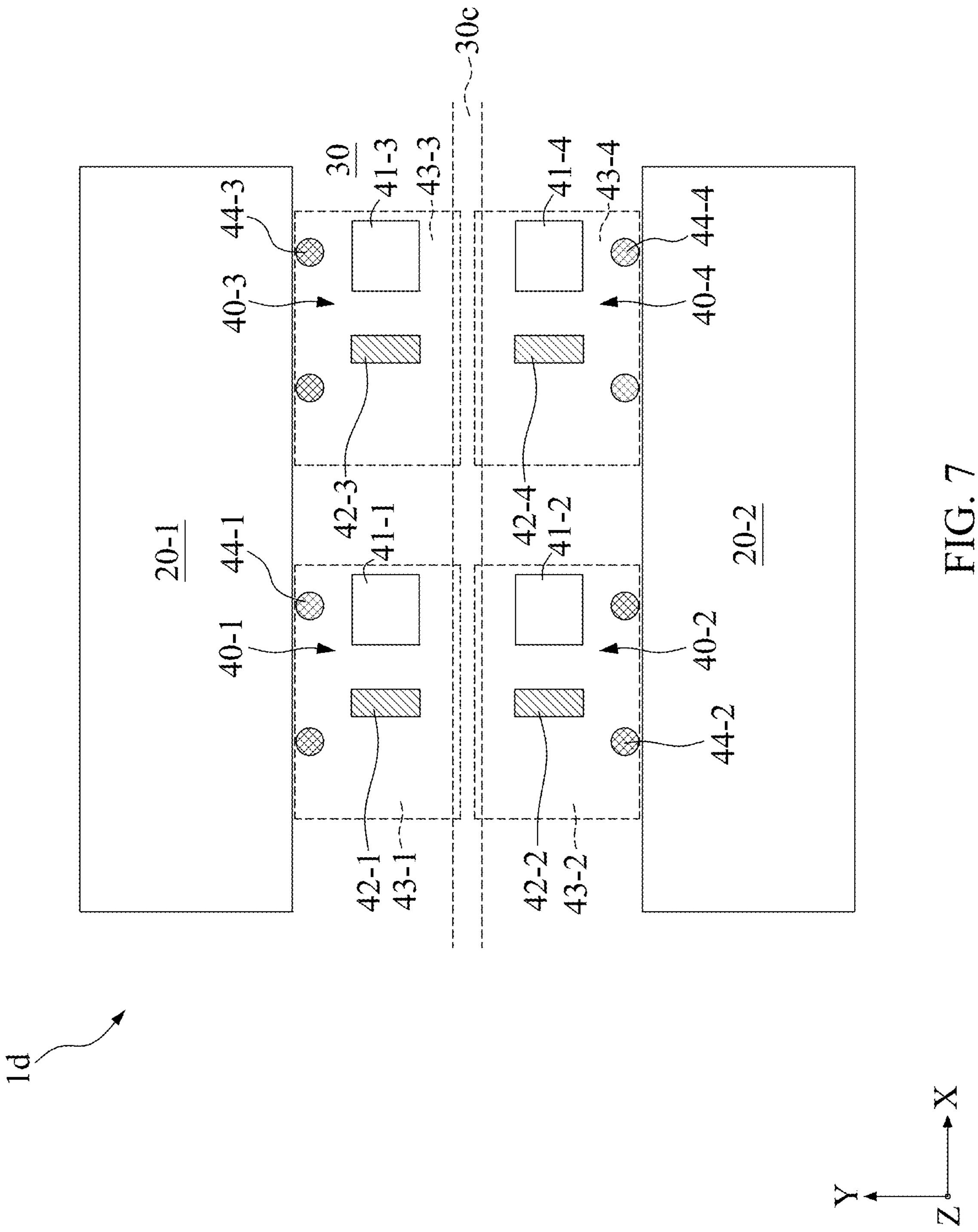
FIG. 7 is a top view of a semiconductor device, in accordance with some embodiments of the present disclosure.

FIG. 7 is a top view of a semiconductor device 1*d*, in accordance with some embodiments of the present disclosure. The semiconductor device 1*d* has a structure similar to that of the semiconductor device 1*a*, with differences below.

In some embodiments, a portion of the interconnection structure 43-1 (e.g., the conductive trace) is located within the cutting region 30*c*, while the via structure 44-1 is free from overlapping the cutting region 30*c* along the Z direction. In some embodiments, a portion of the interconnection structure 43-2 is located within the cutting region 30*c*, while the via structure 44-2 is free from overlapping the cutting region 30*c* along the Z direction. In some embodiments, a portion of the interconnection structure 43-3 is located within the cutting region 30*c*, while the via structure 44-3 is free from overlapping the cutting region 30*c* along the Z direction. In some embodiments, a portion of the interconnection structure 43-4 is located within the cutting region 30*c*, while the via structure 44-4 is free from overlapping the cutting region 30*c* along the Z direction.

Since a conductive trace is less likely to break during singulation compared to a conductive via, a portion of the conductive trace may be disposed within the cutting region 30*c*. Therefore, a portion of the interconnection structures 43-1 to 43-4 may be disposed within the cutting region 30*c*, which may facilitate the miniaturization of the scribe line 30.

Figure 9:
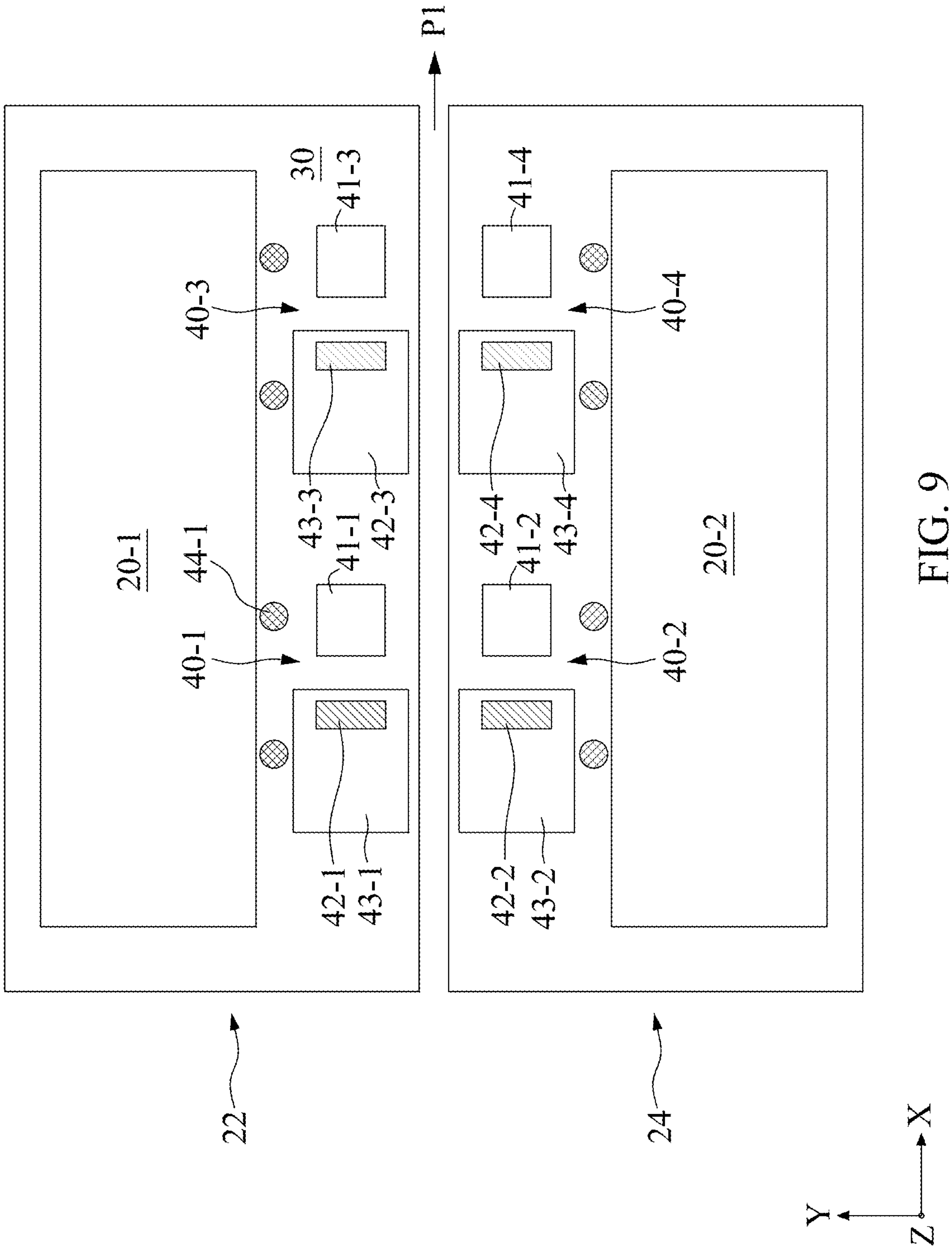
FIG. 9 illustrates one or more stages of an example of a method for manufacturing a semiconductor device according to some embodiments of the present disclosure.

FIG. 8 and FIG. 9 illustrate one or more stages of an example of a method for manufacturing a semiconductor device according to some embodiments of the present disclosure.

Referring to FIG. 8, the active region 20-1 and active region 20-2 may be formed and separated by the scribe line 30. The scribe line 30 may define the cutting region 30*c* which will be removed in a subsequent stage. The testing modules 40-1 to 40-4 may be formed within the scribe line 30 and outside the cutting region 30*c*. In some embodiments, the via structures 44-1 to 44-4 may be formed adjacent to the active region 20-1 or active region 20-2. In some embodiments, each of the via structures 44-1 to 44-4 may be free from overlapping the cutting region 30*c* along the Z direction.

Referring to FIG. 9, a singulation technique P1 is performed. As a result, the active region 20-1 is spaced apart from the active region 20-2. Dies 22 and 24 may be produced. The die 22 may include the active region 20-1, the testing module 40-1, and testing module 40-3. The testing module 40-1 and testing module 40-3 may be located at a peripheral region of the die 22. The die 24 may include the active region 20-2, the testing module 40-2, and testing module 40-4. The testing module 40-2 and testing module 40-4 may be located at a peripheral region of the die 24.

In some embodiments, a laser light source may be utilized to isolate the dies 22 and 24. In this embodiment, the via structures 44-1 to 44-4 may be free of being removed by the laser light source. As a result, the smithereens of metallic material may be reduced when performing a singulation technique.

In this embodiment, the sidewall of the die 22 (or 24) may be free of a truncated surface of a metallic material. For example, the sidewall of the die 22 (or 24) may be free of a truncated surface of a conductive via (or a conductive trace).

Figure 10:
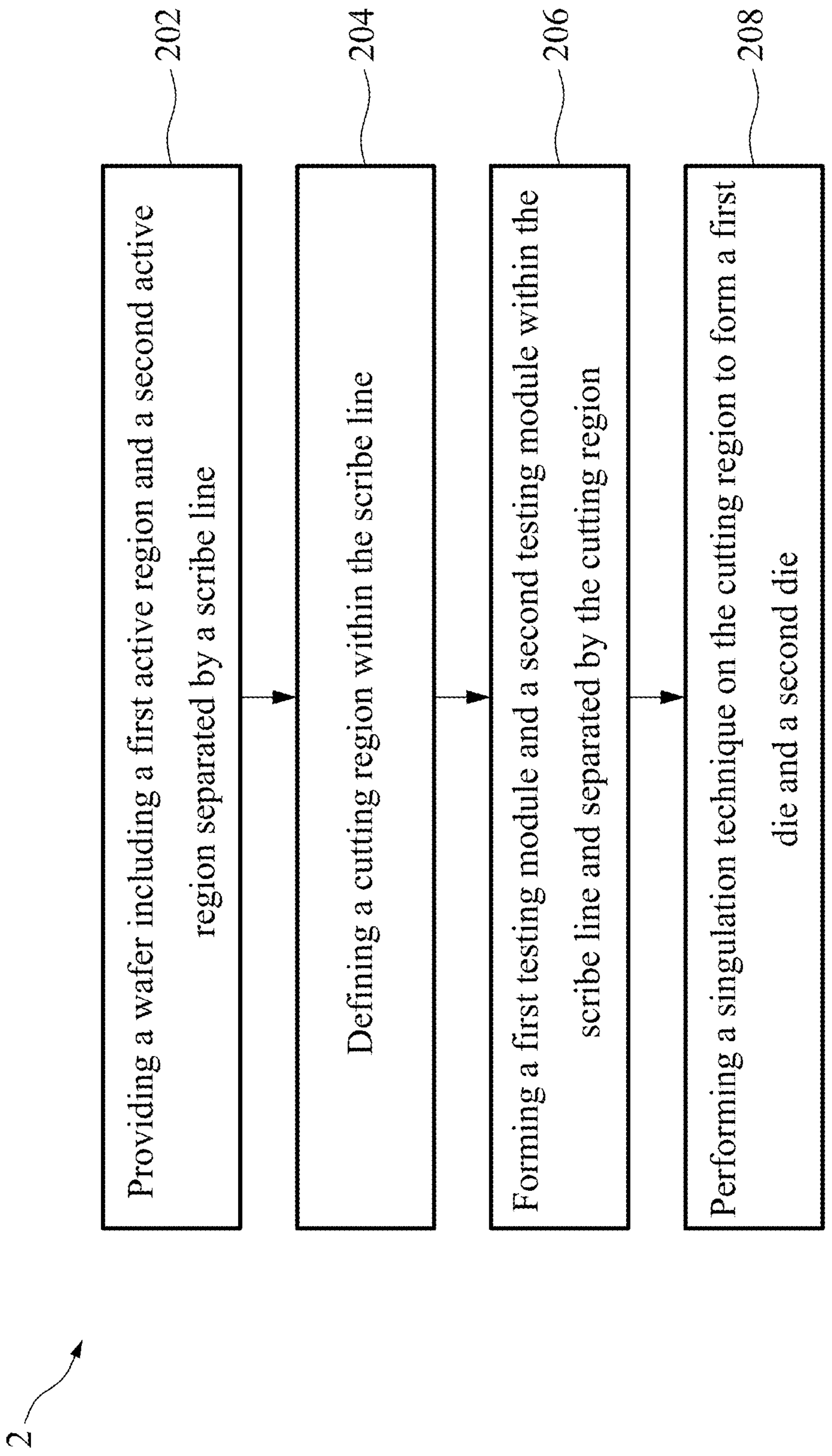
FIG. 10 is a flow chart illustrating a method for manufacturing a semiconductor device, in accordance with various aspects of the present disclosure.

FIG. 10 is a flow chart illustrating a method 2 for manufacturing a semiconductor device, in accordance with various aspects of the present disclosure.

The method 2 begins with operation 202 in which a wafer is provided. A plurality of active regions including a first active region and a second active region are formed. The first active region and the second active region are separated by a scribe line. The first active region and the second active region are arranged along a first direction.

The method 2 continues with operation 204 in which a cutting region is defined between first active region and the second active region. The scribe line extends along a second direction.

The method 2 continues with operation 206 in which a first testing module and a second testing module are formed within the scribe line. The first testing module and the second testing module are arranged along the first direction. The first testing module and the second testing module are separated by the cutting region.

The method 2 continues with operation 208 in which a singulation technique is performed on the cutting region to form a first die and a second die. The first die includes the first active region and the first testing module. The second die includes the second active region and the second testing module. In some embodiments, the testing modules may be free of being cut or removed by the singulation technique, which prevents the chamber of equipment from damage by smithereens of metallic material.

One aspect of the present disclosure provides a semiconductor device. The semiconductor device includes a first active region, a second active region, a first testing module, and a second testing module. The second active region is separated by the first active region by a scribe line. The scribe line extends along a first direction. The first testing module abuts the first active region and is disposed within the scribe line. The second testing module abuts the second active region and is disposed within the scribe line. The first testing module and the second testing module are arranged along a second direction substantially orthogonal to the first direction.

Another aspect of the present disclosure provides a semiconductor device. The semiconductor device includes a first active region, a second active region, and a first testing module. The second active region is separated by the first active region by a scribe line. The scribe line extends along a first direction. The first testing module abuts the first active region and is disposed within the scribe line. The first testing module includes a testing pad, a testing circuit, and a via. The via connects the testing pad and the testing circuit. The via is closer to the first active region than the testing circuit is.

Another aspect of the present disclosure provides a method for manufacturing a semiconductor device. The method includes: forming a plurality of active regions comprising a first active region and a second active region separated from the first active region by a scribe line which extends along a first direction; forming a first testing module and a second testing module within the scribe line, wherein the first testing module and the second testing module are arranged along a second direction substantially orthogonal to the first direction.

The embodiments of the present disclosure provide a semiconductor device including testing modules within a scribe line which extends along a first direction. A first testing modules and a second testing module are arranged along a second direction substantially perpendicular to the first direction. A cutting region is located between the first testing module and the second testing module. With this arrangement, the conductive elements (such as traces and/or vias) of the first testing module and second testing module can avoid being cut, thereby preventing damage to the equipment chamber from smithereens of metallic material.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:

a first active region and a second active region separated by the first active region by a scribe line, wherein the scribe line extends along a first direction;

a first testing module abutting the first active region and disposed within the scribe line, wherein the first testing module comprises:

a first testing pad;

a testing circuit; and a via structure connecting the first testing pad and the testing circuit, wherein the via structure is closer to the first active region than the first testing circuit is; and a second testing module abutting the second active region and disposed within the scribe line, wherein the first testing module and the second testing module are arranged along a second direction substantially orthogonal to the first direction;

wherein the scribe line comprises a cutting region between the first testing module and the second testing module;

wherein the via structure is free from overlapping the cutting region along a third direction substantially perpendicular to the first direction and the second direction;

wherein the first testing module comprises a trace partially overlapping the cutting region.

2. The semiconductor device of claim 1, wherein the second testing module comprises a second testing pad and a second testing circuit arranged along the first direction.

3. The semiconductor device of claim 2, wherein the second testing pad is aligned with the first testing pad along the second direction.

4. The semiconductor device of claim 3, wherein the second testing pad is aligned with the first testing circuit along the second direction.

5. The semiconductor device of claim 1, wherein the second testing pad is misaligned with the first testing pad along the second direction.

6. The semiconductor device of claim 1, further comprising:

a third testing module, wherein the first testing module and the third testing module are arranged along the first direction.

7. The semiconductor device of claim 1, wherein the cutting region is free of metallic materials.

8. The semiconductor device of claim 1, wherein a width of the cutting region ranges from about 0.5 um and about 3 um along the second direction.

9. The semiconductor device of claim 1, wherein the via structure is free from overlapping the cutting region along the first direction.

* * * * *